United States Patent
Chang

(10) Patent No.: US 8,275,568 B2
(45) Date of Patent: *Sep. 25, 2012

(54) SEMICONDUCTOR TEST SYSTEM WITH SELF-INSPECTION OF ELECTRICAL CHANNEL

(75) Inventor: Chung Lung Chang, Hsinchu (TW)

(73) Assignee: King Yuan Electronics Co., Ltd. (TW)

( * ) Notice: Subject to any disclaimer, the term of this patent is extended or adjusted under 35 U.S.C. 154(b) by 514 days.

This patent is subject to a terminal disclaimer.

(21) Appl. No.: 12/457,815

(22) Filed: Jun. 23, 2009

(65) Prior Publication Data
US 2010/0204949 A1 Aug. 12, 2010

(30) Foreign Application Priority Data
Feb. 11, 2009 (TW) ............................. 98104302 A

(51) Int. Cl.
*G01R 27/28* (2006.01)
*G01R 31/26* (2006.01)
*G01R 31/02* (2006.01)

(52) U.S. Cl. .......................... 702/120; 438/14; 324/537

(58) Field of Classification Search .................. 702/120, 702/81, 84, 108, 117–118, 121, 182–183, 702/188–189; 324/522–523, 525, 527, 537; 438/14–15, 17–18; 700/9, 17, 52–53, 81, 700/ 83, 95, 108–109, 117, 121
See application file for complete search history.

(56) References Cited

U.S. PATENT DOCUMENTS

| 4,888,715 A | * | 12/1989 | Tada et al. | ...................... 714/736 |
| 7,847,571 B2 | * | 12/2010 | Chang | ...................... 324/755.05 |
| 2008/0284454 A1 | * | 11/2008 | Chih et al. | ...................... 324/754 |

* cited by examiner

*Primary Examiner* — Toan M Le
(74) *Attorney, Agent, or Firm* — Bacon & Thomas, PLLC

(57) ABSTRACT

A semiconductor test system with self-inspection of an electrical channel is disclosed, which includes a tester head, a plurality of parameter detection units and a self-inspection controller. The tester head includes a plurality of pin electronics cards inserted therein, in which the plurality of pin electronics cards contain a plurality of power channels, a plurality of I/O channels and a plurality of drive channels. The self-inspection controller outputs different inspection signals respectively to each power channel, each I/O channel and each drive channel. Then, the plurality of parameter detection units detect response signals respectively produced by each power channel, each I/O channel and each drive channel in response to the inspection signals respectively received thereby, and the response signals are judged by the self-inspection controller. Thus, the invention is capable of self-inspecting each electrical channel if it is in a normal condition, either in an open or short circuit, or if there exists a leakage condition.

10 Claims, 7 Drawing Sheets

SEMICONDUCTOR TEST SYSTEM WITH SELF-INSPECTION OF ELECTRICAL CHANNEL

BACKGROUND OF THE INVENTION

1. Field of the Invention

The present invention relates to a semiconductor test system with self-inspection of an electrical channel and, more particularly, to a test system for use in a test equipment for IC package.

2. Description of Related Art

In the industry of semiconductor package test, the test bench (machine) and equipment dominate an absolutely important role. If the test bench and equipment are in failure or out of order, big loss in cost will be incurred. In addition, in many occasions of incurring failure or abnormal condition, the bench or equipment itself will not inform or notify the situation and it is hard to trace back when the failure or abnormal condition starts, which quite often results in a serious event of taking back. Not only loss of cost is generated, but also reputation of the company will be affected.

In the test bench and equipment, an electrical channel is mainly used to provide power, I/O and drive for a probe. Pogo pins are used to directly contact a chip or wafer to be tested for testing. As the pogo pins obtain test parameters and send them back through electrical channels, due to that the electrical channels are up to many hundreds or thousands in quantity and are physically visible, inspection of the electrical channels indeed meets with problem. Further, since the electrical channels play a rather important role, once one of the electrical channels is damaged or in an abnormal condition, such as in an unexpected open circuit or short circuit, or in leakage, the whole test quality or test result will be affected.

Although each of the global enterprises in semiconductor test equipments possesses its own techniques of self-inspection of the test bench, they are directed to inspecting the whole equipment, including inspections one by one on each part of the bench and sub-systems. Such inspections waste much time and human labors. As far as the existing techniques are concerned, there is no provision of a system or method with self-inspection of an electrical channel for rapid inspection or adaptively for use in all kinds of equipments produced by all the enterprises.

Therefore, it is desirable to provide an improved semiconductor test system with self-inspection of an electrical channel to mitigate and/or obviate the aforementioned problems.

SUMMARY OF THE INVENTION

An object of the present invention is to provide a semiconductor test system with self-inspection of an electrical channel, comprising a tester head, a plurality of parameter detection units and a self-inspection controller. The tester head includes a plurality of pin electronics cards (PE cards) inserted therein, in which the plurality of pin electronics cards contain a plurality of power channels, a plurality of I/O channels and a plurality of drive channels. In addition, the plurality of parameter detection units are respectively electrically connected to the plurality of power channels, the plurality of I/O channels and the plurality of drive channels in the plurality of pin electronics cards.

The self-inspection controller is electrically connected respectively to the plurality of power channels, the plurality of I/O channels and the plurality of drive channels in the plurality of pin electronics cards, and to the plurality of parameter detection units, in which the self-inspection controller controls inputting different inspection signals respectively to each of the plurality of power channels, each of the plurality of I/O channels and each of the plurality of drive channels, and the plurality of parameter detection units detect response signals respectively produced by each of the plurality of power channels, each of the plurality of I/O channels and each of the plurality of drive channels in response to the inspection signals respectively received thereby and output the same to the self-inspection controller. Thus, before inspecting a wafer to be tested, the invention is capable of self-inspecting each of the electrical channels if it is in a normal condition, either in an open or short circuit, or if there exists a leakage condition.

Moreover, the invention further includes a memory, being electrically connected to the self-inspection controller and storing a set of qualified parameters, in which the self-inspection controller retrieves the response signals, compares them with the set of qualified parameters and outputs a corresponding alarm signal if the comparison shows not matching. Of course, if the comparison shows matching, a normal signal will be outputted. The alarm signal may be in voice, light or electricity, or may be a flag for a comparison result. Similarly, the self-inspection controller of the invention may retrieve the response signals and show them on a display, i.e. directly displaying the response signals without a determining procedure.

The invention further comprises an alarm, being electrically connected to the self-inspection controller, wherein the self-inspection controller outputs the corresponding alarm signal via the alarm. The alarm may be a display, buzzer, vibrator, or any other alarm device capable of generating voice, light or electricity. Thus, the invention is capable of providing functions of determining with self-inspection and outputting with notification.

According to the invention, the set of qualified parameters includes a range of qualified current and a range of qualified voltage, and the inspection signals include an inspection voltage and an inspection current. The self-inspection controller controls inputting the inspection voltage to each of the plurality of power channels and the plurality of parameter detection units respectively measure a response current produced by each of the plurality of power channels in response to the inspection voltage received thereby, which response current is compared with the range of qualified current in the memory. Based on it, it can be inspected if each of the power channels is in a condition of open circuit or short circuit.

Furthermore, the self-inspection controller controls inputting the inspection current respectively to each of the plurality of I/O channels and each of the plurality of drive channel, and the plurality of parameter detection units measure a response voltage respectively produced by each of the plurality of I/O channels and each of the plurality of drive channels in response to the inspection current received thereby, which response voltage is compared with the range of qualified voltage in the memory. Among which, the input inspection current is to be distinguishable from the input inspection voltage, but not limited to inputting the inspection current. It may similarly input the inspection voltage and measure the response current to inspect if each of the plurality of I/O channels and each of the plurality of drive channels are in a condition of open circuit or short circuit.

In addition, the set of qualified parameters further includes a further range of qualified current and the inspection signals additionally include a further inspection voltage. The self-inspection controller controls inputting the further inspection voltage to each of the plurality of I/O channels and each of the plurality of drive channels, and the plurality of parameter detection units measure a further response current respectively produced by each of the plurality of I/O channels and each of the plurality of drive channels in response to the further inspection voltage received thereby, which further response current is compared with the further range of qualified current in the memory. Based on it, it can be inspected if each of the plurality of I/O channels and each of the plurality of drive channels are in a condition of leakage Preferably, according to the invention, the set of qualified parameters further includes a still further range of qualified current and the inspection signals additionally include a still further inspection voltage. The self-inspection controller controls inputting the still further inspection voltage to each of the plurality of I/O channels and each of the plurality of drive channels, and the plurality of parameter detection units measure a still further response current respectively produced by each of the plurality of I/O channels and each of the plurality of drive channels in response to the still further inspection voltage received thereby, which still further response current is compared with the still further range of qualified current in the memory. The control of inputting the still further inspection voltage by the self-inspection controller is mainly used for verifying if there is a condition of leakage.

Meantime, the invention may further comprise a memory, being electrically connected to the self-inspection controller, in which the self-inspection controller retrieves the response signals and stores the response signals in the memory, so as to record the inspection result. Moreover, the invention further comprises a central server, being electrically connected to the self-inspection controller via a network. Similarly, the self-inspection controller retrieves the response signals and stores the response signals in the central server via the network. The central server is mainly used for recording and managing. As such, the invention may be extended to that a central server may proceed with managing and recording for a plurality of benches (machines).

Other objects, advantages, and novel features of the invention will become more apparent from the following detailed description when taken in conjunction with the accompanying drawings.

DETAILED DESCRIPTION OF THE PREFERRED EMBODIMENT

Figure 1:
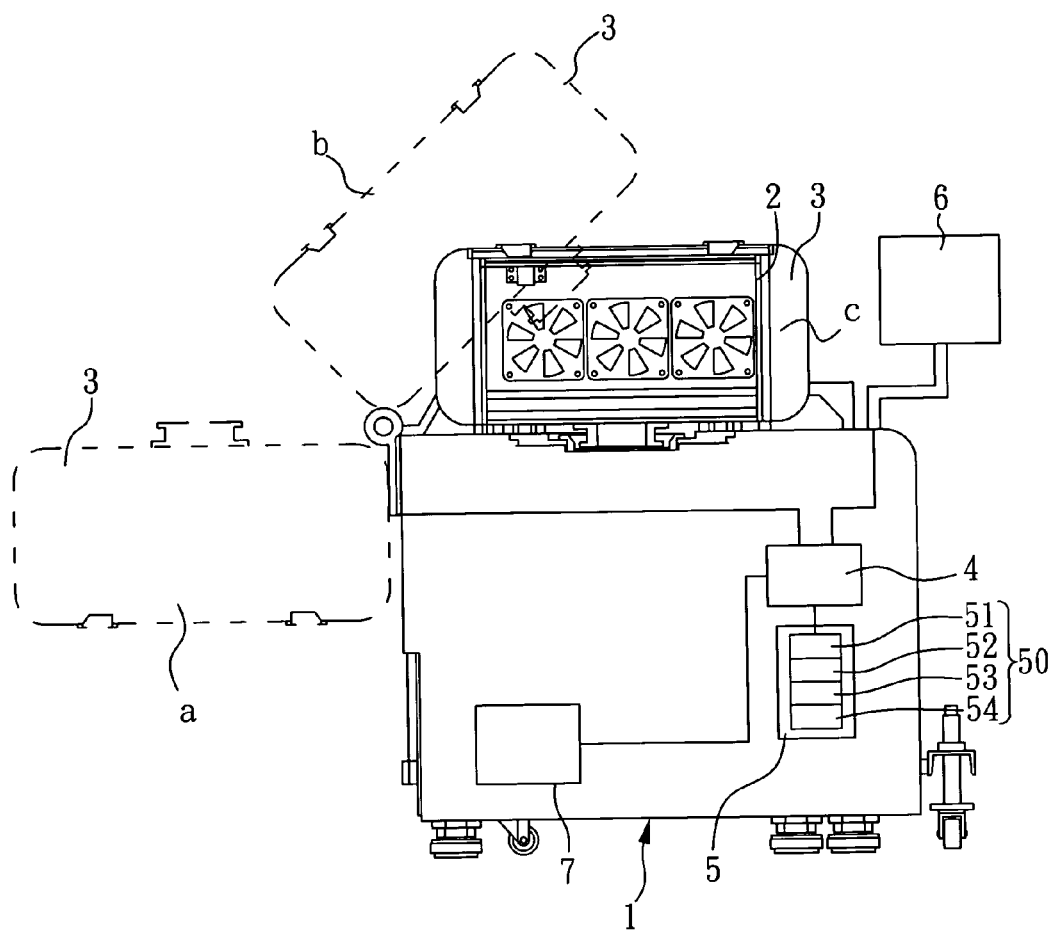
FIG. 1 is a schematic diagram showing a semiconductor test equipment as a whole according to a preferred embodiment of the invention.
Figure 2:
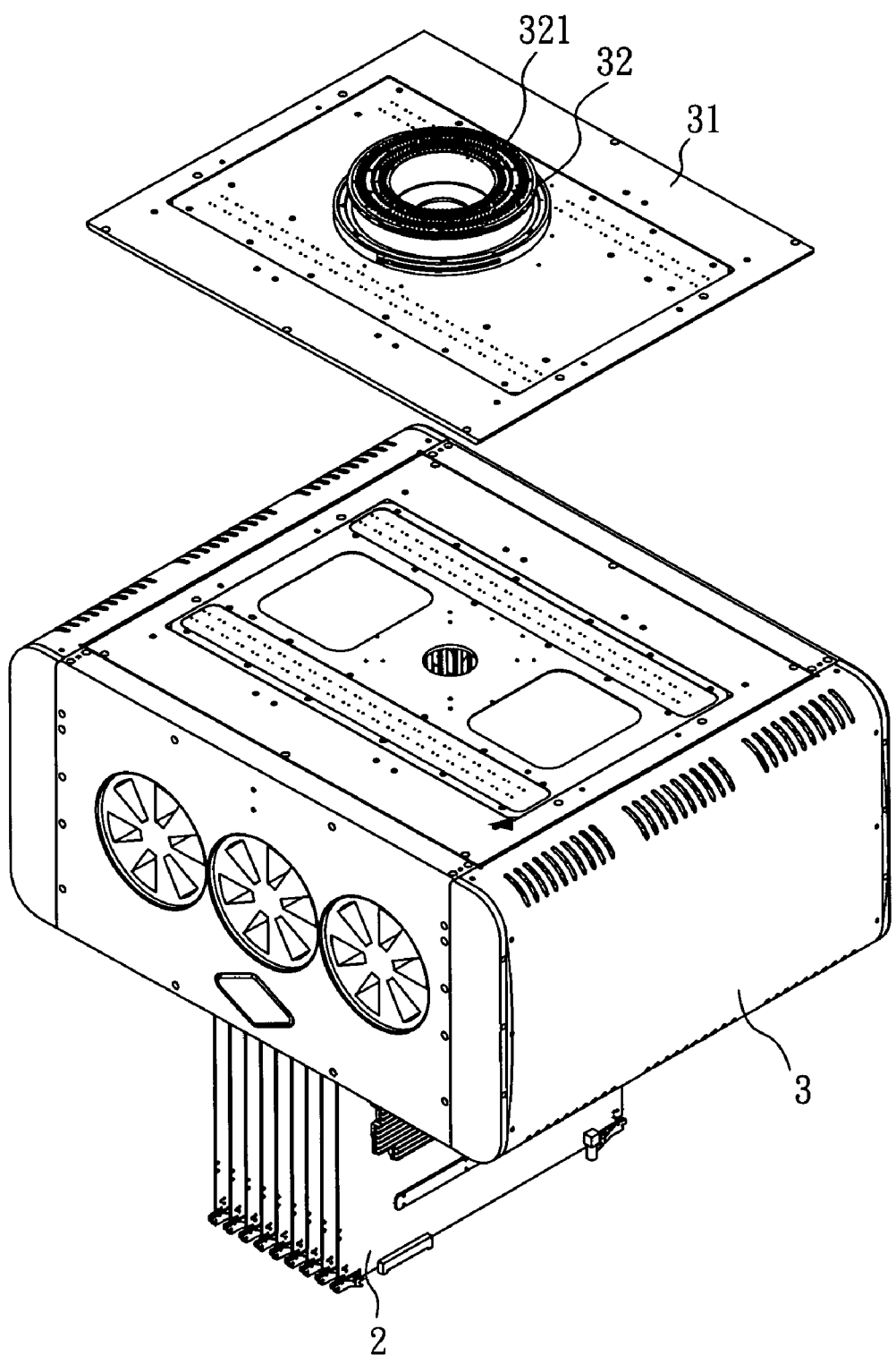
FIG. 2 is a perspective view showing a tester head being located in position a, according to a preferred embodiment of the invention.
Figure 3:
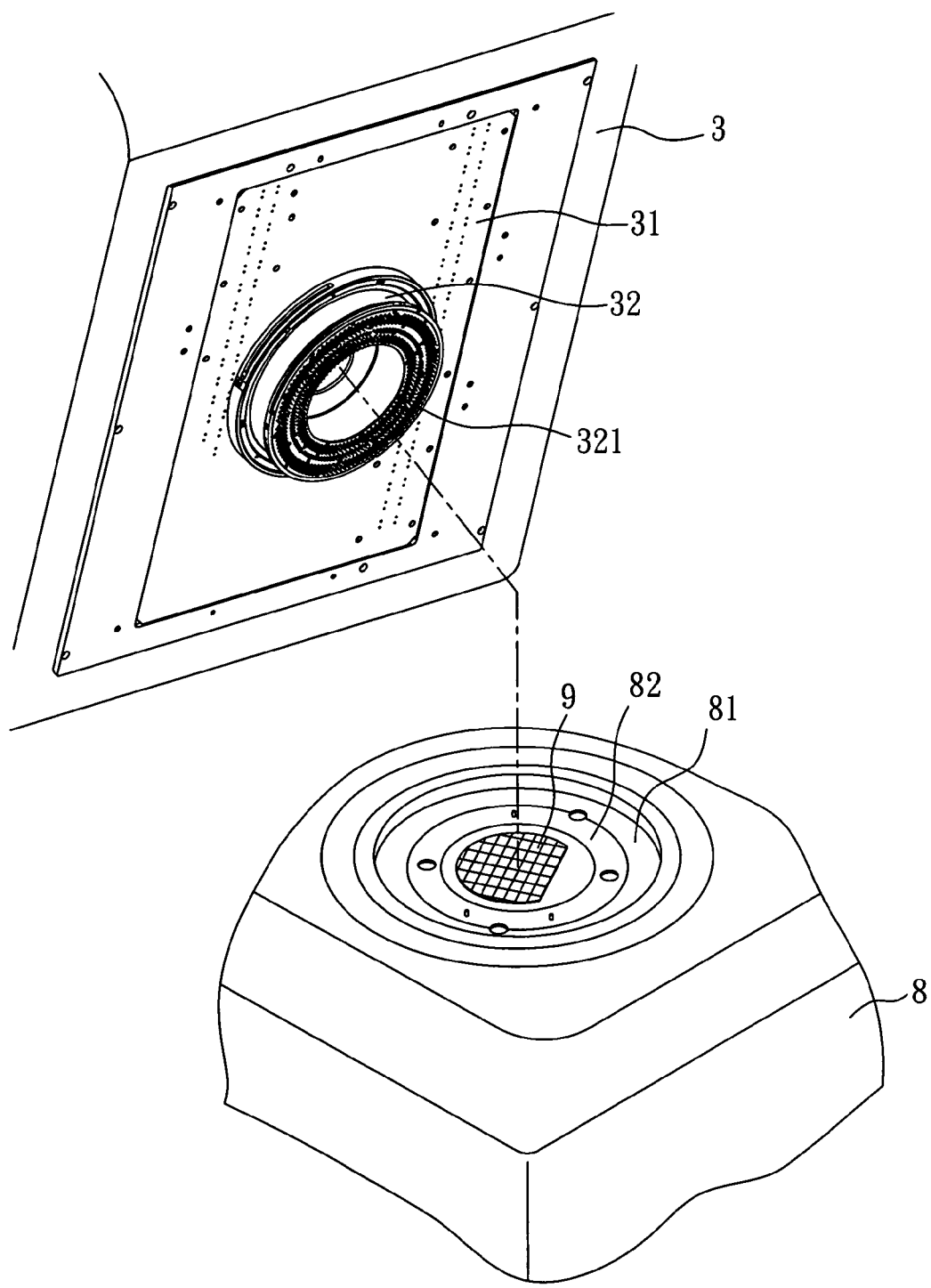
FIG. 3 is a three-dimensional diagram showing a chassis and a tester head, being located in position b, according to a preferred embodiment of the invention.

Please refer to FIGS. 1, 2 and 3 concurrently. FIG. 1 is a schematic diagram showing a semiconductor test equipment as a whole, provided with a semiconductor test system with self-inspection of an electrical channel, according to a preferred embodiment of the invention. FIG. 2 is a perspective view showing a tester head being located in position a according to a preferred embodiment of the invention. FIG. 3 is a three-dimensional diagram showing a chassis and a tester head, being located in position b, according to a preferred embodiment of the invention. The figures show a test bench 1, on which is provided with a tester head 3. A plurality of pin electronics cards 2 (PE cards) are inserted in the tester head 3. A lower surface of the tester head 3 is provided with a load board 31, on which a Pogo tower 32 is disposed. A plurality of Pogo pins 321 are provided on the Pogo tower 32.

Figure 4:
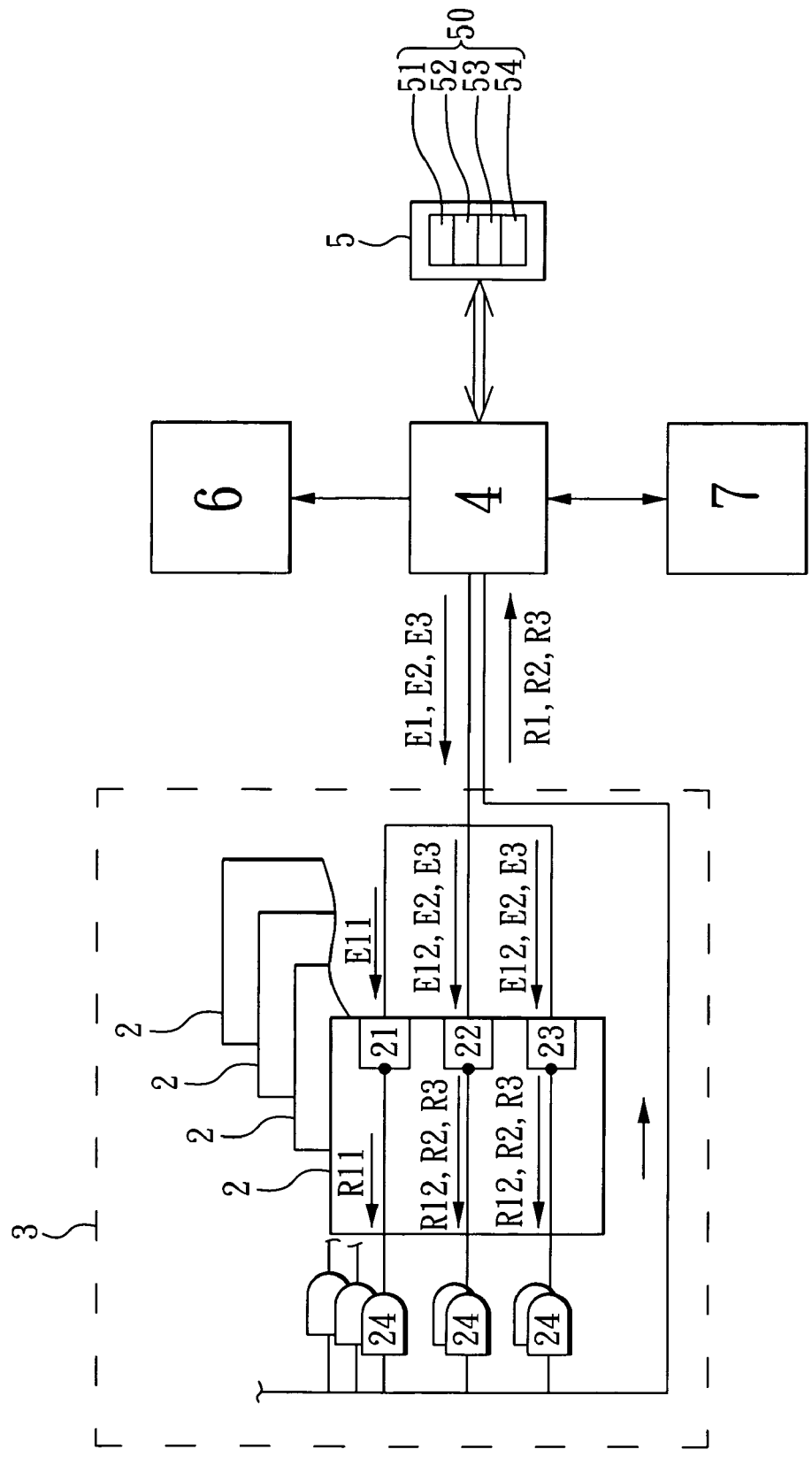
FIG. 4 shows a system structure according to a preferred embodiment of the invention.

Please refer to FIG. 4. FIG. 4 shows a system structure of a semiconductor test system with self-inspection of an electrical channel according to a preferred embodiment of the invention. As shown, the plurality of pin electronics cards 2 contain a plurality of power channels 21, a plurality of I/O channels 22 and a plurality of drive channels 23. In the plurality of pin electronics cards 2, each of the plurality of power channels 21, each of the plurality of I/O channels 22 and each of the plurality of drive channels 23 are respectively electrically connected to the Pogo pin 321 on the Pogo tower 32 through the load board 31 for providing the power and data transmission required for test and for inputting a particular signal to drive a wafer to be tested.

Based on it, as shown in FIG. 3, a chassis 8 is provided, on which a carry platform 81 is installed. The carry platform 81 is concavely provided with a receiving trough 82. A wafer to be tested 9 is placed in the receiving trough 82. As the test bench is in a normal operation, the tester head 3 will move down for closing, and the plurality of Pogo pins 321 on the Pogo tower 32 will contact the wafer to be tested 9 for testing. Of course, the carry platform 81 may proceed with three-axis movements to carry the wafer to be tested 9 thereon for proceeding with detailed inspection in different test contacts.

Further, this embodiment includes a central server (not shown in the drawing), which is electrically connected with a plurality of test benches (not shown in the drawing) with different specifications via a network. The central server stores test programs corresponding to the plurality of test benches with different specifications and provide test results for recording and managing. As the test bench 1 is to proceed with self-inspection of an electrical channel, it only needs to input instructions (such as advan_contact_diag) in any catalogs or a particular catalog. The test bench 1 will automatically download test programs from the central server to the particular catalog in the bench and automatically execute the same, while the result of execution will be stored in the bench and the central server at the same time so as to facilitate monitoring and managing.

Please refer to FIG. 4. It shows that the plurality of pin electronics cards 2 contain a plurality of parameter detection units 24, being respectively electrically connected to the plurality of power channels 21, the plurality of I/O channels 22 and the plurality of drive channels 23. In this embodiment, the plurality of parameter detection units 24 refer to a plurality of current detection units and a plurality of voltage detection units mainly for inspecting voltage and current.

In addition, FIG. 4 additionally shows a self-inspection controller 4, being electrically connected respectively to the plurality of power channels 21, the plurality of I/O channels 22 and the plurality of drive channels 23 in the plurality of pin electronics cards 2, and to the plurality of parameter detection units 24, a memory 5, an alarm 6 and a power supply module 7, in which the self-inspection controller 4 controls inputting different inspection signals E1,E2,E3 respectively to each of the plurality of power channels 21, each of the plurality of I/O channels 22 and each of the plurality of drive channels 23, and controls the plurality of parameter detection units 24 to detect response signals R1,R2,R3 respectively produced by each of the plurality of power channels 21, each of the plurality of I/O channels 22 and each of the plurality of drive channels 23 in response to the inspection signals E1,E2,E3 respectively received thereby and to output the same to the self-inspection controller.

Furthermore, the memory 5 stores a set of qualified parameters 50. The self-inspection controller 4 retrieves the response signals R1,R2,R3, compares them with the set of qualified parameters 50 and outputs a corresponding alarm signal if the comparison shows not matching. For example, since the alarm 6 in this embodiment is a display, labeling of the electrical channel shown on the display for not matching after comparison is "FAIL". If the comparison shows matching, a normal signal will be outputted and the labeling of the electrical channel shown on the display is "PASS". Of course, the alarm signal may be one of voice, light or electricity, such as generating voice, lighting or vibration, or may be a flag for the comparison result.

Figure 5:
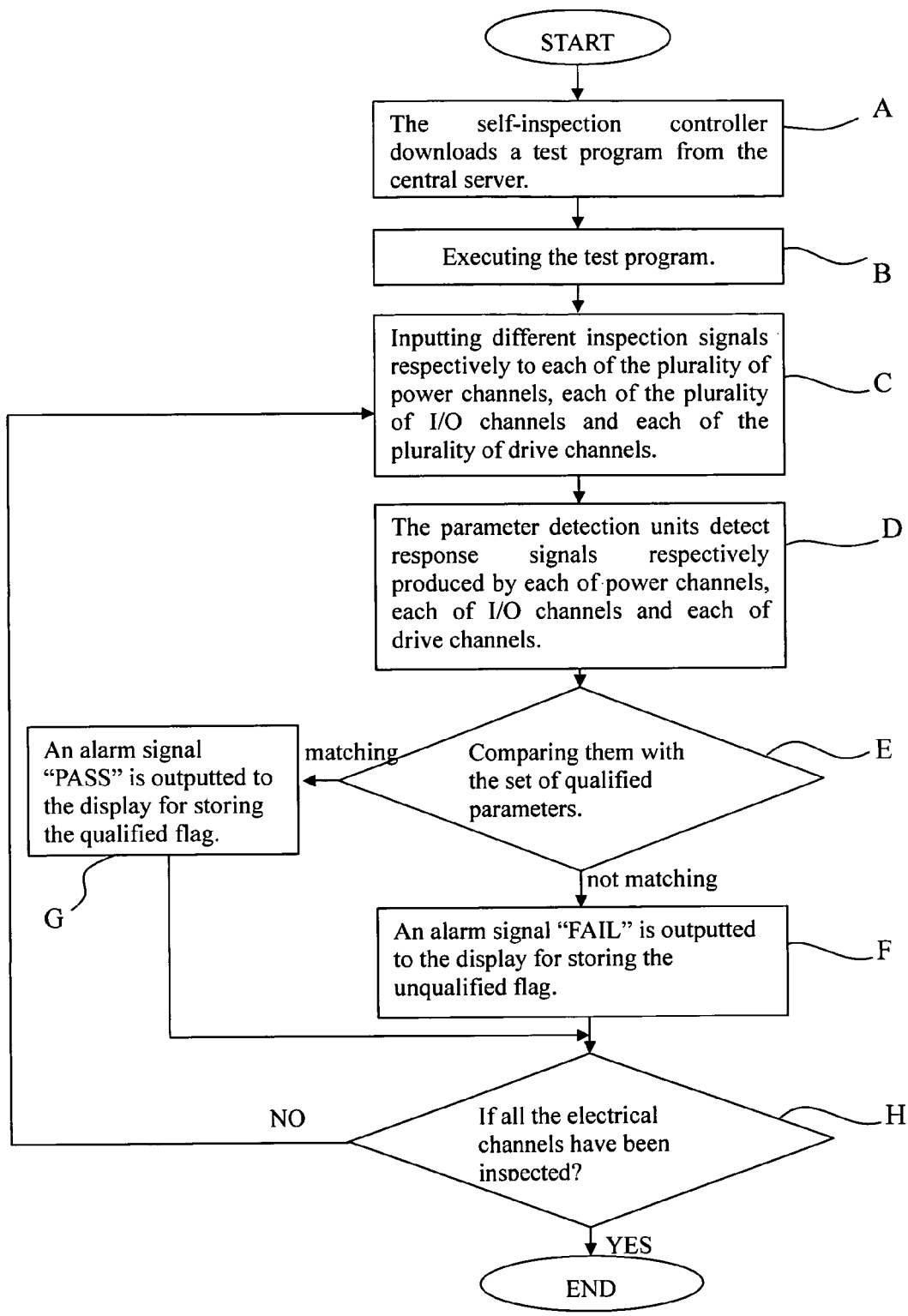
FIG. 5 shows a flow chart according to a preferred embodiment of the invention.

Please refer to FIG. 5. FIG. 5 shows a flow chart for a semiconductor test system with self-inspection of an electrical channel according to a preferred embodiment of the invention. The operations of the flow in this embodiment are as follows: Firstly, the self-inspection controller 4 downloads a test program from the central server (Step A) and automatically executes the test program (Step B). After execution, the self-inspection controller 4 controls inputting different inspection signals E1,E2,E3 respectively to each of the plurality of power channels 21, each of the plurality of I/O channels 22 and each of the plurality of drive channels 23 (Step C). The plurality of parameter detection units 24 detect response signals R1,R2,R3 respectively produced by each of the plurality of power channels 21, each of the plurality of I/O channels 22 and each of the plurality of drive channels 23 in response to the inspection signals E1,E2,E3 respectively received thereby (Step D). After that, the self-inspection controller 4 retrieves the response signals R1,R2,R3 and compares them with the set of qualified parameters 50 in the memory 5 (Step E). If the comparison shows not matching, an alarm signal "FAIL" is outputted to the display for storing the unqualified flag (Step F). If the comparison shows matching, an alarm signal "PASS" is outputted to the display for storing the qualified flag (Step G). At last, the self-inspection controller 4 determines if all the electrical channels have been inspected completely (Step H), if not, repeating the Step C, and if yes, ending the test program.

Figure 6:
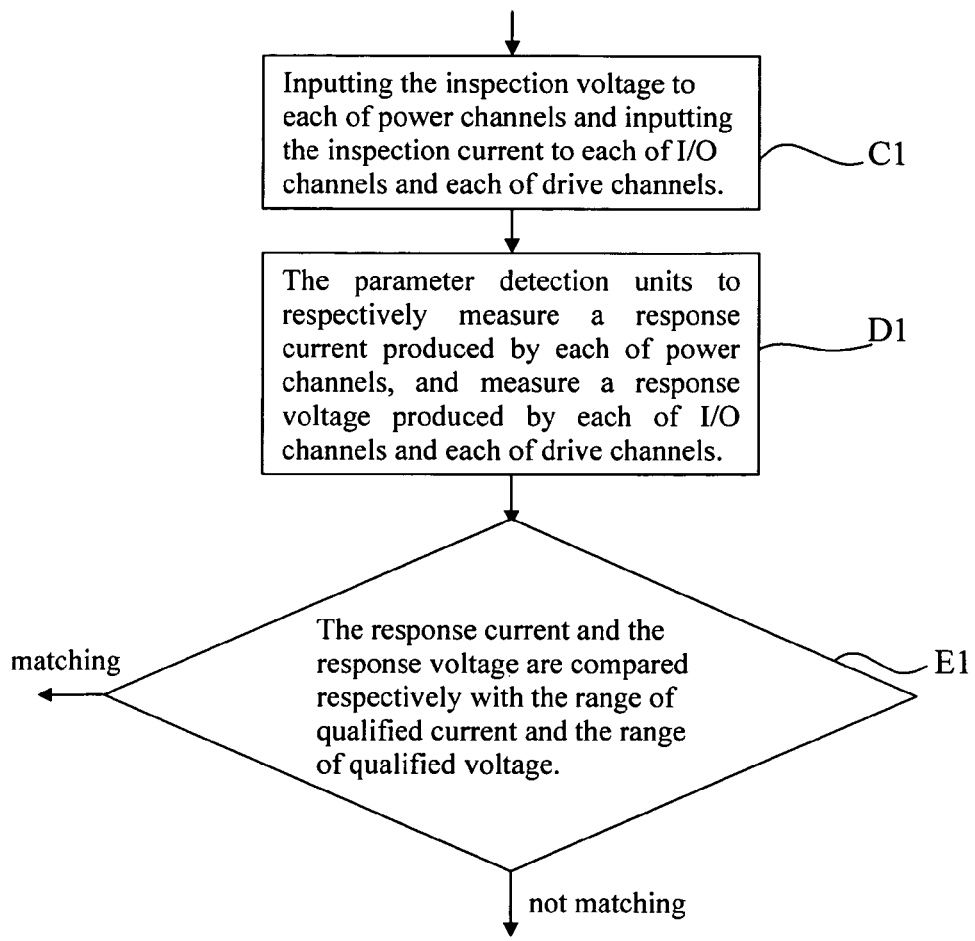
FIG. 6 shows a flow chart for inspecting an open circuit or short circuit according to a preferred embodiment of the invention.

Please refer to FIG. 4 together with FIG. 6. FIG. 6 shows a flow chart of inspecting an open circuit or short circuit for a semiconductor test system with self-inspection of an electrical channel according to a preferred embodiment of the invention. As shown, the set of qualified parameters 50 includes a range of qualified current 51 and a range of qualified voltage 52, and the inspection signal E1 refers respectively to an inspection voltage E11 and an inspection current E12. Based on it, in this embodiment, the invention comprises the following steps for inspecting if the electrical channels 21, 22, 23 are each in an open circuit or short circuit. Firstly, the self-inspection controller 4 controls respectively inputting the inspection voltage E11 to each of the plurality of power channels 21 and inputting the inspection current E12 to each of the plurality of I/O channels 22 and each of the plurality of drive channels 23 (Step C1). Then, the self-inspection controller 4 controls the plurality of parameter detection units 24 to respectively measure a response current R11 produced by each of the plurality of power channels 21 in response to the inspection voltage E11 received thereby, and controls the plurality of parameter detection units 24 to respectively measure a response voltage R12 produced by each of the plurality of I/O channels 22 and each of the plurality of drive channels 23 in response to the inspection current E12 received thereby (Step D1). Lastly, in the self-inspection controller 4, the response signal R1, i.e. the response current R11, and the response voltage 12 are compared respectively with the range of qualified current 51 and the range of qualified voltage 52 in the memory 5 (Step E1). Certainly, after comparison, the abnormal electrical channel and the normal electrical channel will be displayed in the display simultaneously, and then be recorded and stored.

In this embodiment, the inspection voltage E11 inputted to each of the plurality of power channels 21 is 5V (volts), and the range of qualified current 51 is preset with 0 A-900 nA (nano-ampere, $10^{-9}$ A). Since each of the plurality of power channels 21 is preset with a short circuit, the normal value of the measured response current R11 should be 0 A to some hundreds of nA. If an abnormal condition occurs, a range of some tens to some hundreds of uA (micro-ampere, $10^{-6}$ A) will be measured. In addition, in this embodiment, the inspection current E12 for each of the plurality of I/O channels 22 and each of the plurality of drive channels 23 is 100 uA, and the range of qualified voltage 52 is preset with 3V (clamp value). Since each of the plurality of I/O channels 22 and each of the plurality of drive channels 23 are preset with an open circuit, in a normal condition, the response voltage R12 will be within the range of qualified voltage 52. If exceeded, it indicates an abnormal situation.

Figure 7:
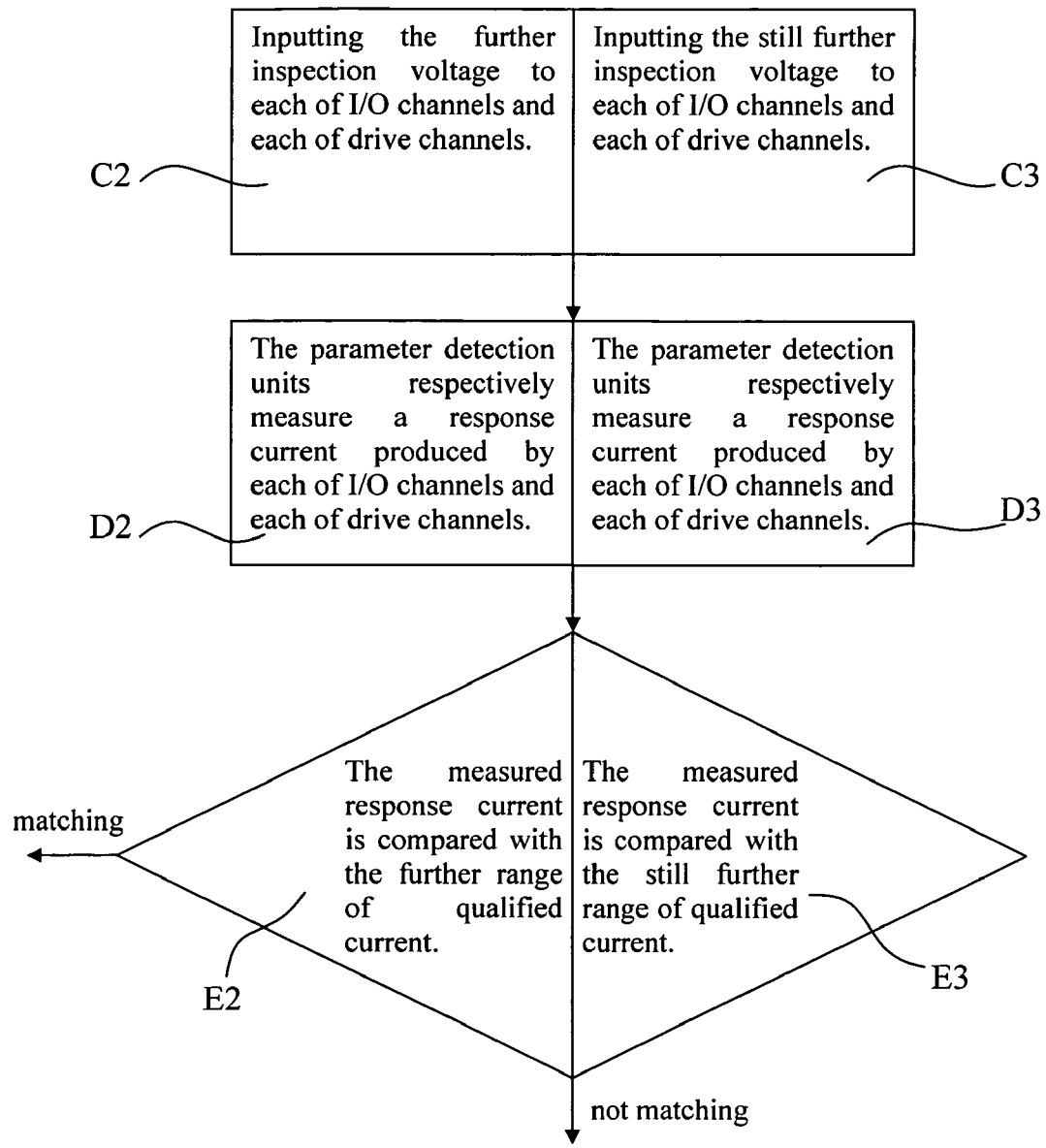
FIG. 7 shows a flow chart for inspecting leakage according to a preferred embodiment of the invention.

Please refer to FIG. 4 together with FIG. 7. FIG. 7 shows a flow chart of inspecting leakage for a semiconductor test system with self-inspection of an electrical channel according to a preferred embodiment of the invention. The invention further provides a function of leakage detection. In the memory 5, the set of qualified parameters 50 additionally includes a further range of qualified current 53 and a still further range of qualified current 54, and the inspection signals E2,E3 respectively refer to a further inspection voltage E2 and a still further inspection voltage E3. Based on it, in this embodiment, the invention comprises the following steps for inspecting if the electrical channels 21, 22, 23 are in leakage. Firstly, the self-inspection controller 4 controls respectively inputting the further inspection voltage E2 to each of the plurality of I/O channels 22 and each of the plurality of drive channels 23 (Step C2). Then, the self-inspection controller 4 controls the plurality of parameter detection units 24 to respectively measure a response current R2 produced by each of the plurality of I/O channels 22 and each of the plurality of drive channels 23 in response to the further inspection voltage E2 received thereby (Step D2). Lastly, in the self-inspection controller 4, the measured response current R2 is compared with the further range of qualified current 53 in the memory 5 (Step E2).

Thereafter, in this embodiment, a second time of leakage inspection is verified as follows. Similarly, the self-inspection controller 4 controls respectively inputting the still further inspection voltage E3 to each of the plurality of I/O channels 22 and each of the plurality of drive channels 23 (Step C3). Then, the plurality of parameter detection units 24 respectively measure a response current R3 produced by each of the plurality of I/O channels 22 and each of the plurality of drive channels 23 in response to the still further inspection voltage E3 received thereby (Step D3). And then, in the self-inspection controller 4, the measured response current R3 is compared with the still further range of qualified current 54 in the memory 5 (Step E3). Lastly, comparing and verifying the above-mentioned response signals, i.e. the response currents R2,R3, it may accurately be known if there is a leakage condition.

In this embodiment of leakage inspection, the inspection voltages E2,E3 inputted are 0V and 5V (volts), respectively. The ranges of qualified current 53,54 are preset respectively with 0 A-900 nA (nano-ampere, $10^{-9}$ A). In a normal condition, there should be no leakage situation and the measured response currents R2,R3 should be some hundreds of nA. If an abnormal condition occurs, a range of some tens to some hundreds of uA (microampere, $10^{-6}$ A) will be measured.

Although the present invention has been explained in relation to its preferred embodiment, it is to be understood that many other possible modifications and variations can be made without departing from the scope of the invention as hereinafter claimed.

What is claimed is:

1. A semiconductor test system with self-inspection of an electrical channel, comprising:
   a tester head, including a plurality of pin electronics cards (PE cards) inserted therein, the plurality of pin electronics cards containing a plurality of power channels, a plurality of I/O channels and a plurality of drive channels;
   a plurality of parameter detection units, being respectively electrically connected to the plurality of power channels, the plurality of I/O channels and the plurality of drive channels in the plurality of pin electronics cards; and
   a self-inspection controller, being electrically connected respectively to the plurality of power channels, the plurality of I/O channels and the plurality of drive channels in the plurality of pin electronics cards, and to the plurality of parameter detection units, in which the self-inspection controller controls inputting different inspection signals respectively to each of the plurality of power channels, each of the plurality of I/O channels and each of the plurality of drive channels, and the plurality of parameter detection units detect response signals respectively produced by each of the plurality of power channels, each of the plurality of I/O channels and each of the plurality of drive channels in response to the inspection signals respectively received thereby and output the same to the self-inspection controller.

2. The semiconductor test system with self-inspection of an electrical channel as claimed in claim 1, further comprising a memory, being electrically connected to the self-inspection controller and storing a set of qualified parameters, in which the self-inspection controller retrieves the response signals, compares them with the set of qualified parameters and outputs a corresponding alarm signal if the comparison shows not matching.

3. The semiconductor test system with self-inspection of an electrical channel as claimed in claim 2, further comprising an alarm, being electrically connected to the self-inspection controller, wherein the self-inspection controller outputs the corresponding alarm signal via the alarm.

4. The semiconductor test system with self-inspection of an electrical channel as claimed in claim 3, wherein the alarm is a display.

5. The semiconductor test system with self-inspection of an electrical channel as claimed in claim 2, wherein the set of qualified parameters includes a range of qualified current and a range of qualified voltage, and the inspection signals include an inspection voltage and an inspection current,
   and wherein the self-inspection controller controls inputting the inspection voltage to each of the plurality of power channels, and the plurality of parameter detection units respectively measure a response current produced by each of the plurality of power channels in response to the inspection voltage received thereby, which the response current is compared with the range of qualified current in the memory; and the self-inspection controller controls inputting the inspection current respectively to each of the plurality of I/O channels and each of the plurality of drive channel, and the plurality of parameter detection units measure a response voltage respectively produced by each of the plurality of I/O channels and each of the plurality of drive channels in response to the inspection current received thereby, which the response voltage is compared with the range of qualified voltage in the memory.

6. The semiconductor test system with self-inspection of an electrical channel as claimed in claim 2, wherein the set of qualified parameters additionally includes a further range of qualified current and the inspection signals additionally include a further inspection voltage,
   and wherein the self-inspection controller controls inputting the further inspection voltage to each of the plurality of I/O channels and each of the plurality of drive channels and the plurality of parameter detection units measure a further response current respectively produced by each of the plurality of I/O channels and each of the plurality of drive channels in response to the further inspection voltage received thereby, which the further response current is compared with the further range of qualified current in the memory.

7. The semiconductor test system with self-inspection of an electrical channel as claimed in claim 6, wherein the set of qualified parameters additionally includes a still further range of qualified current and the inspection signals additionally include a still further inspection voltage,
   and wherein the self-inspection controller controls inputting the still further inspection voltage to each of the plurality of I/O channels and each of the plurality of drive channels and the plurality of parameter detection units measure a still further response current respectively produced by each of the plurality of I/O channels and each of the plurality of drive channels in response to the still further inspection voltage received thereby, which the still further response current is compared with the still further range of qualified current in the memory.

8. The semiconductor test system with self-inspection of an electrical channel as claimed in claim 1, further comprising a display, being electrically connected to the self-inspection controller, in which the self-inspection controller retrieves the response signals and displays the response signals via the display.

9. The semiconductor test system with self-inspection of an electrical channel as claimed in claim 1, further comprising a memory, being electrically connected to the self-inspection controller, in which the self-inspection controller retrieves the response signals and stores the response signals in the memory.

10. The semiconductor test system with self-inspection of an electrical channel as claimed in claim 1, further comprising a central server, being electrically connected to the self-inspection controller via a network, in which the self-inspection controller retrieves the response signals and stores the response signals in the central server via the network.

* * * * *